United States Patent [19]
Bryant et al.
[11] 3,766,406
[45] Oct. 16, 1973

[54] ECL-TO-TTL CONVERTER

[75] Inventors: Richard W. Bryant, Poughkeepsie; George K. Tu, Wappingers Falls, both of N.Y.

[73] Assignee: Cogar Corporation, Wappingers Falls, N.Y.

[22] Filed: Dec. 6, 1971

[21] Appl. No.: 204,816

Related U.S. Application Data

[63] Continuation of Ser. No. 65,224, Aug. 17, 1970, abandoned.

[52] U.S. Cl................... 307/203, 307/207, 307/214
[51] Int. Cl....................... H03k 19/08, H03k 19/40
[58] Field of Search.................... 307/203, 207, 214, 307/215, 218

[56] References Cited

UNITED STATES PATENTS

| | | | |
|---|---|---|---|
| 3,259,761 | 7/1966 | Narud et al. | 307/203 X |
| 3,505,535 | 4/1970 | Cavaliere | 307/203 |
| 3,521,086 | 7/1970 | Slob | 307/203 X |
| 3,544,808 | 12/1970 | Mukai | 307/214 |
| 3,564,281 | 2/1971 | Tokunaga et al. | 307/214 |

*Primary Examiner*—John Zazworsky
*Attorney*—Harry M. Weiss

[57] ABSTRACT

An ECL-to-TTL converter having an ECL input stage for deriving a signal to drive a TTL output stage. The TTL output stage includes a pair of transistors arranged in a push-pull configuration for maximum speed of operation.

1 Claim, 2 Drawing Figures

INVENTORS
RICHARD W. BRYANT
GEORGE K. TU

Gottlieb, Rackman & Reisman
BY Harry M Weiss
ATTORNEYS

ECL-TO-TTL CONVERTER

This is a continuation of U.S. Pat. Ser. No. 65,224, filed Aug. 17, 1970, same inventors, now abandoned.

This invention relates to ECL-to-TTL converters, and more particularly to converters which can operate at very fast switching speeds.

Transistor-transistor-logic (TTL) systems generally operate on signal levels below 0.3 volts and above 3.5 volts. Emitter-coupled-logic (ECL) circuits operate at different voltage levels. The precise levels differ from manufacturer to manufacturer but as a rule the difference between the two ECL levels is less than the difference between the two TTL levels. As a typical (although not limiting) example, the two ECL levels might be 1.6 and 2.4 volts.

There are many ECL-to-TTL and TTL-to-ECL converters which have been designed for interface purposes in order that TTL and ECL logic systems be compatible with each other. To convert ECL signal levels to TTL signal levels, it is apparent that a small ECL input swing must result in a larger TTL output swing. One of the main problems with prior art ECL-to-TTL converters is that the output is relatively slow in switching from the low level to the high level.

It is a general object of our invention to provide a fast-switching ECL-to-TTL converter.

Briefly, in accordance with the principles of our invention, the output stage of the converter includes two transistor arranged in a push-pull configuration. An ECL input signal causes opposite potentials to be applied to the bases of the two transistors in the push-pull configuration. Only one of the two transistors conducts at any time. The output of the converter is taken at the junction of the emitter of one of the transistors and the collector of the other. Because the output terminal is always shorted through one of the transistors to ground or a positive potential source, the output potential is actively pulled up or down in response to any input step.

It is a feature of our invention to provide in an ECL-to-TTL converter a pair of transistors at the output of the coverter arranged in a push-pull configuration.

Further objects, features and advantages of our invention will become apparent upon consideration of the following detailed description in conjunction with the drawing, in which.

Figure 1:
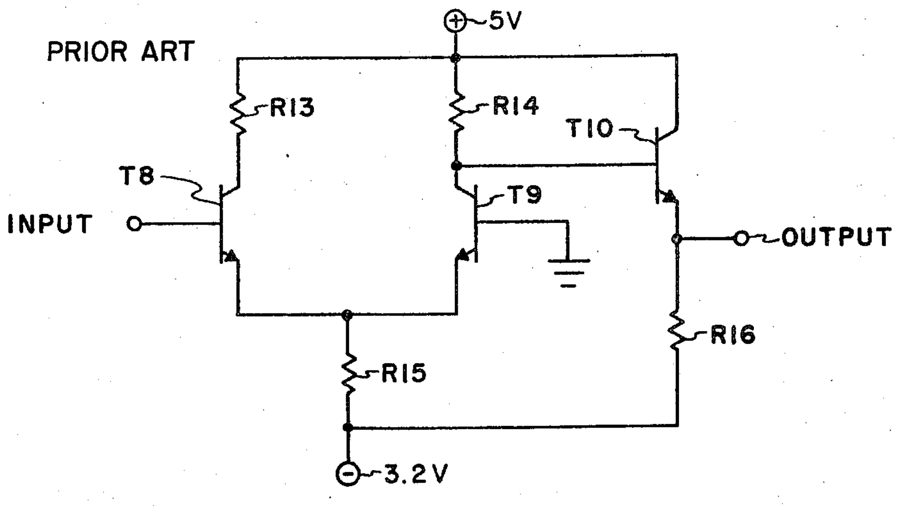
FIG. 1 PRIOR ART
FIG. 1 depicts a typical prior art type circuit.

Referring to FIG. 1, it is assumed that the ECL signal levels are −0.4 and +0.4 volts. The input signal is applied to the base of transistor T8 while the base of transistor T9 is grounded. The transistors comprise a conventional current switch. Since the emitters of both transistors are coupled through resistor R15 to a negative potential source, only one transistor conducts — the transistor with the higher base potential. Thus, for a negative input transistor T9 conducts, and for a positive input transistor T8 conducts. When transistor T9 is off, its collector is coupled through resistor R14 to a 5-volt potential source which is thus applied to the base of transistor T10. The transistor conducts and a high potential appears at the output terminal, the high potential being equal to the 5-volt source less the drop across transistor T10. Thus a high ECL input signal at the base of transistor T8 results in a high TTL output potential at the emitter of transistor T10.

On the other hand, if the input signal is low, transistor T9 conducts and the base-emitter junction of transistor T10 is reverse biased. In such a case, the negative potential source is extended through resistor R16 to the output terminal. It is apparent that the converter circuit functions to convert relatively low magnitude ECL signal levels to large magnitude TTL levels.

The problem with the circuit of FIG. 1 is that it takes considerable time for the output potential to fall following a drop in the input signal. When the input signal is high, the base of transistor T10 is high in potential so that the output is at the high TTL level. Base-emitter current flows and charge is stored in the parasitic capacitances exhibited at the base of transistor T10. When the input signal drops and the collector potential of transistor T9 falls, transistor T10 should turn off immediately so that the output potential can similarly fall. However, transistor T10 does not turn off until there is no longer a base-emitter forward bias, and this does not occur until the stored base charge is dissipated through transistor T9. There is no active pull-down of the output terminal and thus fast switching speeds are not possible.

Figure 2:
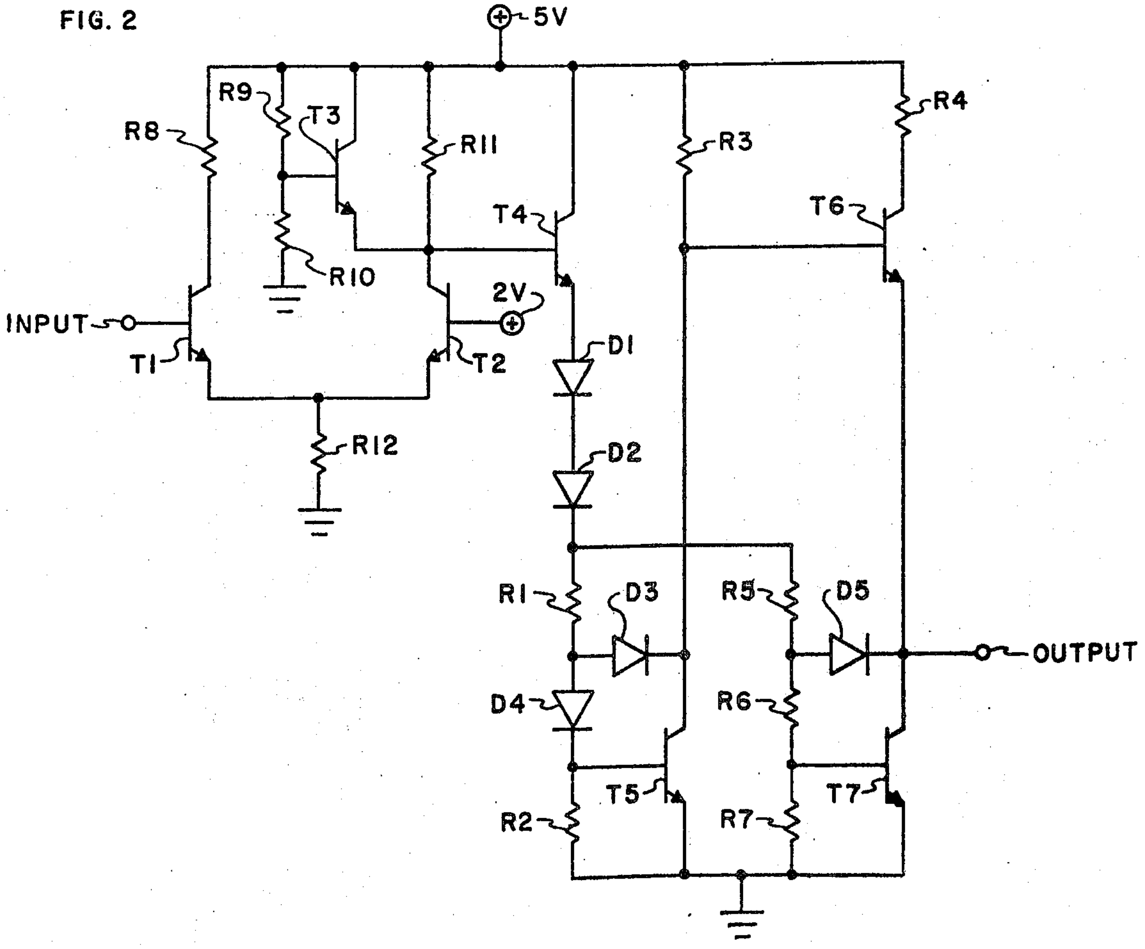
FIG. 2 depicts the illustrative embodiment of our invention.

In the circuit of FIG. 2, it is assumed that the ECL levels are 1.6 and 2.4 volts. (A similar circuit can be designed for any ECL signal levels.) The base of transistor T2 is connected to a 2-volt source and as the input signal swings between 1.6 and 2.4 volts it is apparent that one or the other of transistors T1 and T2 conducts. The current flowing from the conducting one of the transistors through resistor R12 reverse biases the base-emitter junction of the other transistor. When transistor T2 conducts, with current flowing through resistor R11, the transistor and resistor R12, there is a tendency for the collector voltage of transistor T2 to fall too low and thus saturate transistor T2. This, in turn, would prevent the transistor from switching off rapidly when the input signal goes high. To prevent saturation of transistor T2, a clamp comprising transistor T3, and resistors R9 and R10, is provided. The clamp itself is conventional in the art, and can be used, for example, with the circuit of FIG. 1. The potential at the base of transistor T3 is determined by the voltage divider relationship of resistors R9 and R10. The potential at the emitter of transistor T3 is equal to the base potential less the 0.8-volt drop across the base-emitter junction of the transistor. The collector of transistor T2 is clamped to this voltage and cannot fall below it.

The collector of transistor T2 is connected to the base of transistor T4. Transistor T4 functions as an emitter follower, with the potential at the emitter of the transistor being equal to that at the base less the base-emitter drop of 0.8 volts. Diodes D1 and D2 simply translate the signal downward by 1.6 volts since the drop across each diode is .8 volts. The potential at the cathode of diode D2 is applied to two parallel paths — resistor R1, diode D4 and resistor R2, and resistors R5, R6 and R7. The reason for the use of diode D4 and resistor R6 in the two cases will be explained below. The purpose of each of the two circuits is to extendd the potential at the cathode of diode D2 to the base of a respective one of transistors T5 and T7.

Consider the case in which the higher signal level appears at the cathode of diode D2. Each of transistors T5 and T7 turns on. With the turning on of transistor T5, current flows from the 5-volt source through resistor R3 and the transistor to ground. The junction of resistor R3 and the collector of transistor T5 is close to ground potential, and since this junction is connected to the base of transistor T6, transistor T6 remains off. With transistor T6 off, and transistor T7 on, the output terminal is shorted through transitor T7 to ground and a low TTL signal in the order of a few tenths of a volt appears at the output terminal.

On the other hand, with a lower signal level at the cathode of diode D2, both of transistors T5 and T7 remain off. With transistor T5 off, the 5-volt potential is extended through resistor R3 to the base of transistor T6, and transistor T6 turns on. With transistor T7 off, the output terminal is coupled through the base-emitter junction of transistor T6 to the 5-volt source to develop a high TTL output.

Diodes D3 and D5 serve simply to prevent either of transistors T5 and T7 from saturating when they conduct. With respect to transistor T5, since the drops across diodes D3 and D4 are equal and their anodes are connected together, it is apparent that the collector potential of the transistor cannot fall below the base potential. Consequently, the transistor cannot saturate. As for transistor T7, diode D5 insures that the collector potential does not fall more than 0.8 volts below the potential at the junction of resistors R5 and R6, and the resistors are all selected such that the potential at the junction of resistors R5 and R6 is above that level which would result in the saturation of transistors T7.

The reason for using resistor R6 in the base circuit of transistor T7 rather than a diode such as diode D4 is that when transistor T7 conducts its collector potential must be less than the collector potential of transistor T5 when the latter transistor conducts. The use of diode D4 in the base circuit of transistor T5 causes the collector voltage, when transistor T5 conducts, to be at 0.8 volts. This is because the base-emitter drop of transistor T5 is 0.8 volts, as is the drop across diode D4. Therefore, the potential at the junction of diodes D3 and D4 is 1.6 volts, and since there is a 0.8-volt drop across diode D3 the potential at the collector of transistor T5 is 0.8 volts. This potential is low enough to keep transistor T6 from turning on and yet is high enough to allow transistor T6 to turn on rapidly when transistor T5 is turned off. However, a lower potential is required at the collector of transistor T7 when this transistor conducts since the low TTL output signal level must be .4 volts or less. By substituting resistor R6 for diode D4, there is less of a drop from the anode of diode D5 to the base of transistor T7 then there is from the anode of diode D3 to the base of transistor T5. When transistor T7 conducts, the junction of resistors R5 and R6 is at 1.2 volts, and thus as a result of the 0.8-volt drop across diode D5 the output potential is at 0.4 volts.

The major advantage of the circuit of FIG. 2 is that the output potential can be switched very rapidly between levels. A positive going output transition is controlled by forcing transistor T6 to conduct while transistor T7 is held off. (Transistor T6 is actually turned on by holding transistor T5 off along with transistor T7.) A negative step at the output is controlled by causing transistor T7 to turn on thus shorting the output to ground. Both transistions are very fast. For example, suppose that transistor T6 is on and transistor T7 is off, so that the output potential is high. A negative going transition is controlled by turning transistor T6 off and turning transistor T7 on. The positive base drive to transistor T7 turns the transistor on rapidly so that the output potential falls quickly as the transistor turns on. Conversely, when a positive transition is required, transistor T7 turns off and transistor T6 turns on. The positive base drive of transistor T6 causes the output potential to rise rapidly. In both cases, the output potential is actively driven to one or the other of the two levels by one of the two transistors T6 and T7 in the push-pull configuration. While in the circuit of FIG. 1, when transistor T9 turns on the output potential falls only after the base charge has dissipated, in the circuit of FIG. 2 the output terminal is actively driven by one or the other of the output transistors in both cases. The converter circuit in FIG. 2 can thus be used at higher speeds.

Although the invention has been described with reference to a particular embodiment, it is to be understood that this embodiment is merely illustrative of the application of the principles of the invention. Numerous modifications may be made therein and other arrangements may be devised without departing from the spirit and scope of the invention.

What is claimed is:

1. An ECL-to-TTL converter comprising an ECL current switch having an input terminal and an output terminal, said ECL current switch comprising a pair of transistors with the emitters of said pair of transistors connected together and the base of one of said pair of transistors being said input terminal, said ECL current switch further comprising a resistor electrically connected to the emitters of said pair of transistors, clamping means comprising a third transistor and a pair of voltage divider resistors connected to the base of said third transistor for clamping the collector of the other of said pair of transistors, a fourth transistor, said base of said fourth transistor being connected to the collector of said other of said pair of transistors, said fourth transistor being an emitter follower of said other transistor of said pair of transistors, a pair of diodes connected in series to the emitter of said fourth transistor, the cathode of one of said pair of diodes being connected to two parallel paths, one of said two parallel paths having a resistor, a diode and a resistor connected in series to said cathode, the other of said two parallel paths have three resistors connected in series, one of said two parallel paths extends the potential at said cathode to the base of a fifth transistor, the other of said two parallel paths extends the potential at said cathode to the base of a seventh transistor, said ECL-to-TTL converter having an output stage comprising a pair of transistors, said seventh transistor comprising one of said pair of transistors and a sixth transistor comprising the other of said pair of transistors, the emitter of said sixth transistor being connected to the collector of said seventh transistor, the junction of said emitter of said sixth transistor and the collector of said seventh transistor being the output terminal of said ECL-to-TTL converter, a diode associated with said seventh transistor connected from between the junction of said emitter of said sixth transistor and the collector of said seventh transistor to between two of said three resistors of said other of said two parallel paths, a diode associated with said fifth transistor connected between the collector of said fifth transistor to the junction between the first resistor and said diode of said one of said two parallel paths.

* * * * *